(12) United States Patent
Nakashima (10) Patent No.: US 11,456,718 B2
(45) Date of Patent: Sep. 27, 2022

(54) MULTILAYER TRIPLEXER

(71) Applicant: Murata Manufacturing Co., Ltd., Nagaokakyo (JP)

(72) Inventor: Yasuhiro Nakashima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 211 days.

(21) Appl. No.: 16/987,426

(22) Filed: Aug. 7, 2020

(65) Prior Publication Data

US 2020/0366264 A1 Nov. 19, 2020

Related U.S. Application Data

(63) Continuation of application No. PCT/JP2019/006720, filed on Feb. 22, 2019.

(30) Foreign Application Priority Data

Mar. 9, 2018 (JP) .............................. JP2018-043657

(51) Int. Cl.
*H03H 7/46* (2006.01)
*H03H 1/00* (2006.01)
(Continued)

(52) U.S. Cl.
CPC .............. *H03H 7/463* (2013.01); *H03H 1/00* (2013.01); *H03H 7/1766* (2013.01); *H03H 7/38* (2013.01); *H03H 2001/0085* (2013.01)

(58) Field of Classification Search
CPC ........ H03H 7/463; H03H 7/1766; H03H 7/38; H03H 1/00
See application file for complete search history.

(56) References Cited

U.S. PATENT DOCUMENTS

2001/0015682 A1 8/2001 Matsumura et al.
2006/0268811 A1 11/2006 Fukunaga
(Continued)

FOREIGN PATENT DOCUMENTS

JP 2001-168669 A 6/2001
JP 2003-087076 A 3/2003
(Continued)

OTHER PUBLICATIONS

Official Communication issued in International Patent Application No. PCT/JP2019/006720, dated May 14, 2019.
(Continued)

*Primary Examiner* — Samuel S Outten
(74) *Attorney, Agent, or Firm* — Keating & Bennett, LLP (57) ABSTRACT

A multilayer triplexer includes a first coil connected between a common terminal and a first filter, a second coil connected between the common terminal and a second filter, and a third coil connected between the common terminal and the third filter. The first coil, the second coil, and the third coil each include a coil conductor pattern between ones of substrate layers of a multilayer body. The coil conductor pattern of the first coil, the coil conductor pattern of the second coil, and the coil conductor pattern of the third coil do not overlap each other when the multilayer body is seen through in a direction in which the substrate layers are stacked on one another.

15 Claims, 9 Drawing Sheets

(51) Int. Cl.
      *H03H 7/01*         (2006.01)
      *H03H 7/38*         (2006.01)

(56)            References Cited

U.S. PATENT DOCUMENTS

| 2010/0091752 | A1  | 4/2010  | Kemmochi et al.          |
| 2010/0231328 | A1* | 9/2010  | Takase ........... H03H 7/463 |
|              |     |         |                  336/200 |
| 2012/0274417 | A1  | 11/2012 | Kihara et al.            |
| 2015/0294781 | A1  | 10/2015 | Yosui et al.             |
| 2017/0179930 | A1* | 6/2017  | Tsukamoto ......... H03H 7/075 |
| 2017/0200550 | A1  | 7/2017  | Kim et al.               |
| 2017/0214390 | A1* | 7/2017  | Tsukamoto ........ H03H 7/1766 |
| 2018/0226952 | A1* | 8/2018  | Tanaka .......... H03H 7/1775 |

FOREIGN PATENT DOCUMENTS

| JP | 2006-333258 | A  | 12/2006 |
| JP | 2010-154138 | A  | 7/2010  |
| JP | 2011-082371 | A  | 4/2011  |
| JP | 2013-062556 | A  | 4/2013  |
| JP | 2013-219409 | A  | 10/2013 |
| JP | 2018-029191 | A  | 2/2018  |
| WO | 2008/075691 | A1 | 6/2006  |
| WO | 2009/104391 | A1 | 8/2009  |
| WO | 2017/119938 | A1 | 7/2017  |

OTHER PUBLICATIONS

Official Communication issued in corresponding Japanese Patent Application No. 2020-504919, dated Apr. 20, 2021.

* cited by examiner

MULTILAYER TRIPLEXER

CROSS REFERENCE TO RELATED APPLICATIONS

This application claims the benefit of priority to Japanese Patent Application No. 2018-043657 filed on Mar. 9, 2018 and is a Continuation Application of PCT Application No. PCT/JP2019/006720 filed on Feb. 22, 2019. The entire contents of each application are hereby incorporated herein by reference.

BACKGROUND OF THE INVENTION

1. Field of the Invention

The present invention relates to a multilayer triplexer including a multilayer substrate in which substrate layers are stacked on one another.

2. Description of the Related Art

Figure 9:
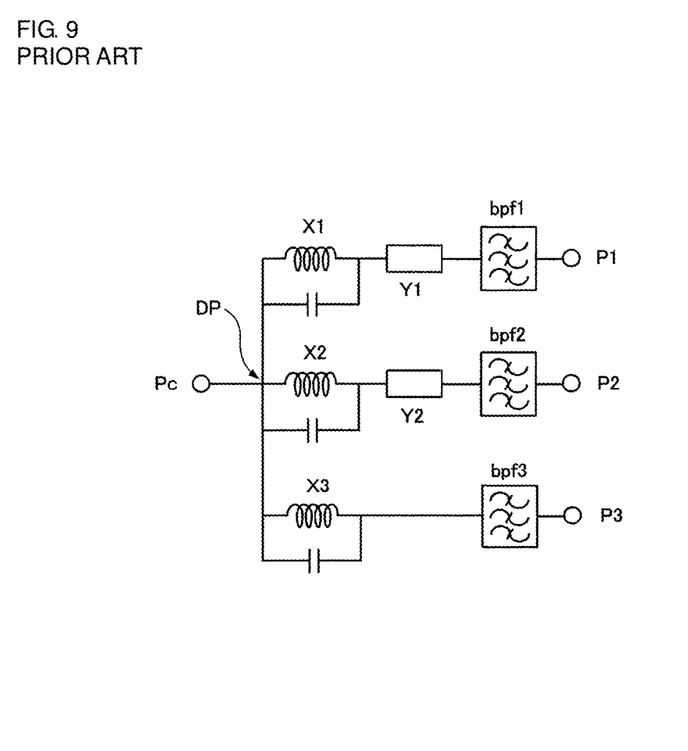
FIG. 9 is a block diagram of a triplexer 1000, which is a triplexer disclosed in International Publication No. 2008/075691.

Triplexers are widely used in electronic devices such as mobile communication devices, most notably mobile phones and smartphones. For example, International Publication No. 2008/075691 discloses a triplexer. FIG. 9 illustrates a triplexer 1000, which is the triplexer disclosed in International Publication No. 2008/075691.

The triplexer 1000 includes a common terminal Pc, a first branch terminal P1, a second branch terminal P2, and a third branch terminal P3.

The triplexer 1000 also includes a first band-pass filter portion bpf1 for a low band, a second band-pass filter portion bpf2 for a middle band, and a third band-pass filter portion bpf3 for a high band. The triplexer 1000 also includes two phase adjustment circuits, namely, a phase adjustment circuit Y1 and a phase adjustment circuit Y2. The triplexer 1000 also includes a first parallel resonant circuit X1, a second parallel resonant circuit X2, and a third parallel resonant circuit X3.

The first parallel resonant circuit X1, the second parallel resonant circuit X2, and the third parallel resonant circuit X3 each include a coil and a capacitor connected in parallel and have, for example, the function of adjusting the impedance.

The triplexer 1000 is configured as follows. As a signal path for the low band, the first parallel resonant circuit X1, the phase adjustment circuit Y1, and the first band-pass filter portion bpf1 are serially connected between the common terminal Pc and the first branch terminal P1. As a signal path for the middle band, the second parallel resonant circuit X2, the phase adjustment circuit Y2, and the second band-pass filter portion bpf2 are serially connected between the common terminal Pc and the second branch terminal P2. As a signal path for the high band, the third parallel resonant circuit X3 and the third band-pass filter portion bpf3 are serially connected between the common terminal Pc and the third branch terminal P3.

A disadvantage of the triplexer 1000 is that signals in a band may be mixed with signals in another band through the capacitor of the first parallel resonant circuit X1, the capacitor of the second parallel resonant circuit X2, or the capacitor of the third parallel resonant circuit X3.

Most capacitors tend to allow passage of signals of high frequencies. Consequently, signals in the middle band or signals in the high band may, for example, enter the signal path for the low band through the capacitor of the first parallel resonant circuit X1. Similarly, signals in the high band may enter the signal path for the middle band through the capacitor of the second parallel resonant circuit X2.

The characteristics or the reliability of the triplexer 1000 may deteriorate due to mixing of signals in a band with signals in another band through the capacitor of the first parallel resonant circuit X1, the capacitor of the second parallel resonant circuit X2, or the capacitor of the third parallel resonant circuit X3.

SUMMARY OF THE INVENTION

Preferred embodiments of the present invention provide multilayer triplexers that each eliminate or reduce the possibility that signals in a band will pass through a stray capacitance and will consequently be mixed with signals in another band.

A multilayer triplexer according to a preferred embodiment includes a multilayer body including substrate layers stacked on one another; a common terminal, a first branch terminal, a second branch terminal, and a third branch terminal on a surface of the multilayer body; a first filter, a second filter, and a third filter in the multilayer body, the first filter being connected to a path extending from the common terminal to the first branch terminal, the second filter being connected to a path extending from the common terminal to the second branch terminal, the third filter being connected to a path extending from the common terminal to the third branch terminal; a first coil connected between the common terminal and the first filter; a second coil connected between the common terminal and the second filter; and a third coil connected between the common terminal and the third filter. The first to third coils each include a coil conductor pattern between ones of the substrate layers of the multilayer body. The coil conductor pattern of the first coil, the coil conductor pattern of the second coil, and the coil conductor pattern of the third coil do not overlap each other when the multilayer is viewed in the direction in which the substrate layers are stacked on one another.

In a multilayer triplexer according to a preferred embodiment of the present invention, the first coil, the second coil, and the third coil each have a winding axis parallel or substantially parallel to the direction in which the substrate layers are stacked on one another.

In a multilayer triplexer according to a preferred embodiment of the present invention, the coil conductor pattern of the least one of the first to third coils includes a first coil conductor pattern and a second coil conductor pattern between respective ones of the substrate layers and are U-shaped. The first coil conductor pattern partially overlaps the second coil conductor pattern in a width direction when the multilayer body is viewed in a direction in which the substrate layers are stacked on one another. The second coil conductor pattern partially overlaps the first coil conductor pattern in the width direction when the multilayer body is viewed in a direction in which the substrate layers are stacked on one another. Of a plurality of coil conductor patterns included in the same coil, a coil conductor pattern between two layers and a coil conductor pattern between another two layers may have stray capacitance arising therebetween when these coil conductor patterns entirely overlap each other.

When the first and second coil conductor patterns do not coincide with each other in the width direction, the stray capacitance is able to be reduced or prevented. This layout eliminates or reduces the possibility that signals in a band will pass through the stray capacitance and will consequently be mixed with signals in another band.

In a multilayer triplexer according to a preferred embodiment of the present invention, when the multilayer body is viewed in the direction in which the plurality of substrate layers are stacked on one another, the coil conductor pattern of one of the first to third coils encloses a region whose area is larger than an area of a region enclosed by the coil conductor pattern of any other coil and includes a third coil conductor pattern and a fourth coil conductor pattern between respective ones of the substrate layers and are U-shaped. The third and fourth coil conductor patterns entirely or substantially entirely overlap each other in a width direction. One of the first to third coils that requires an inductance value larger than the inductance value required by any other coil may have the following features.

As described above, the area of the region enclosed by the coil conductor pattern of the coil concerned is larger than the area of the region enclosed by the coil conductor pattern of any other coil. Of a plurality of coil conductor patterns included in the same coil, a coil conductor pattern between two layers and a coil conductor pattern between another two layers entirely overlap each other in the width direction. As a result of these features, a larger inductance value is able to be obtained.

The first filter, the second filter, and the third filter may be LC filters.

Multilayer triplexers according to preferred embodiments the present invention each include the first coil connected as a stage preceding the first filter, the second coil connected as a stage preceding the second filter, and a third coil connected as a stage preceding the third filter. Unlike the triplexer known in the art, the multilayer triplexers according to preferred embodiments of the present invention do not include parallel resonant circuits each of which include a coil and a capacitor and connected as a stage preceding a corresponding filter. These multilayer triplexers thus eliminate the possibility that signals in a band will pass through a capacitor of a parallel resonant circuit and will consequently be mixed with signals in another band.

In multilayer triplexers according to preferred embodiments of the present invention, the coil conductor pattern of the first coil, the coil conductor pattern of the second coil, and the coil conductor pattern of the third coil do not overlap each other when the multilayer body is seen through in the direction in which the substrate layers are stacked on one another. As a result of this feature, stray capacitance between the coil conductor patterns of different ones of these coils is able to be reduced or prevented. The multilayer triplexer thus eliminates or reduces the possibility that signals in a band will pass through the stray capacitance and will consequently be mixed with signals in another band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings.

The following preferred embodiments of the present invention are merely illustrative and should not be construed as limiting the scope of the present invention. The drawings are provided to facilitate the understanding of the preferred embodiments and may include schematic illustrations. For example, the dimension ratios of components illustrated in the drawings or the relative dimension ratios of the components may be inconsistent with the corresponding dimension ratios described in the description. Some of the components described in the description may be omitted from a drawing, or one or some of the same components may be omitted from a drawing.

Figure 1:
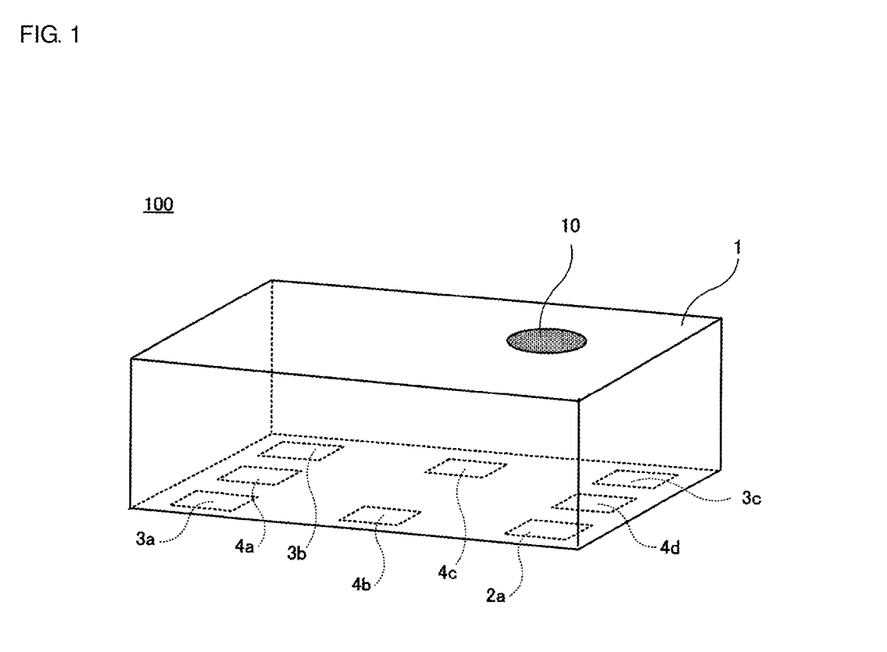
FIG. 1 is a perspective view of a multilayer triplexer 100 according to a preferred embodiment of the present invention.
Figure 2:
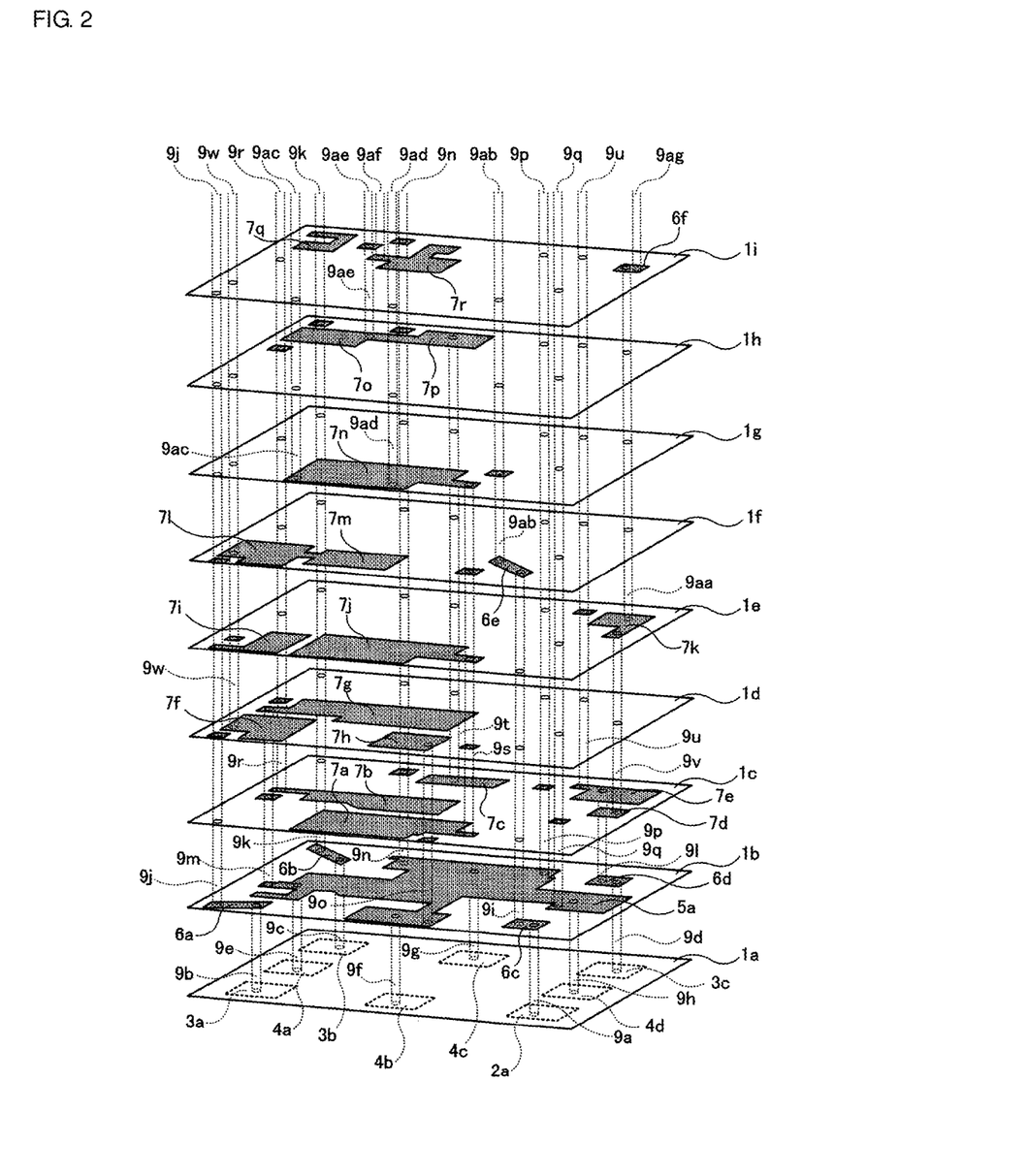
FIG. 2 is an exploded perspective view of a lower portion of the multilayer triplexer 100.
Figure 3:
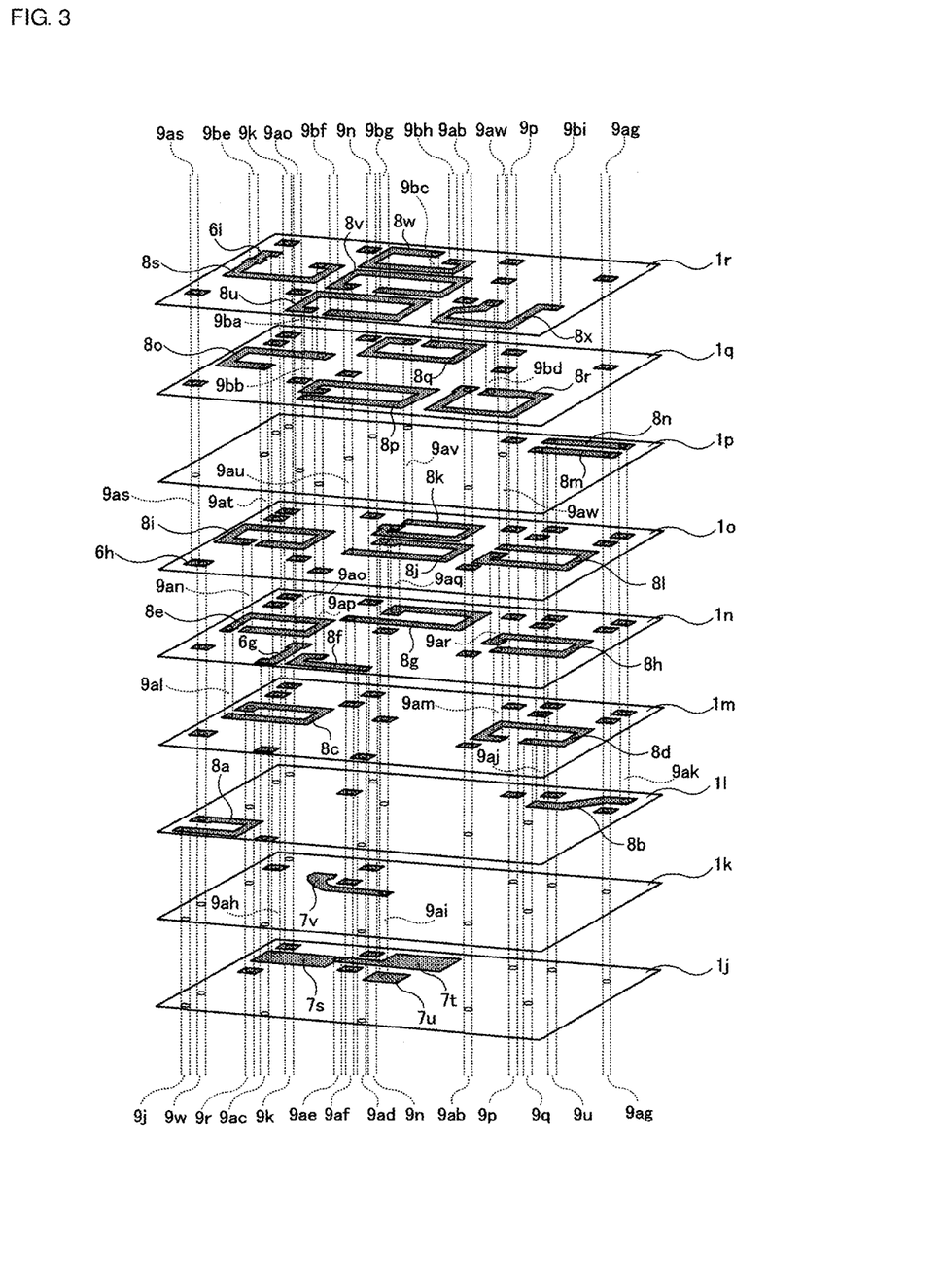
FIG. 3 is an exploded perspective view of a middle portion of the multilayer triplexer 100.
Figure 4:
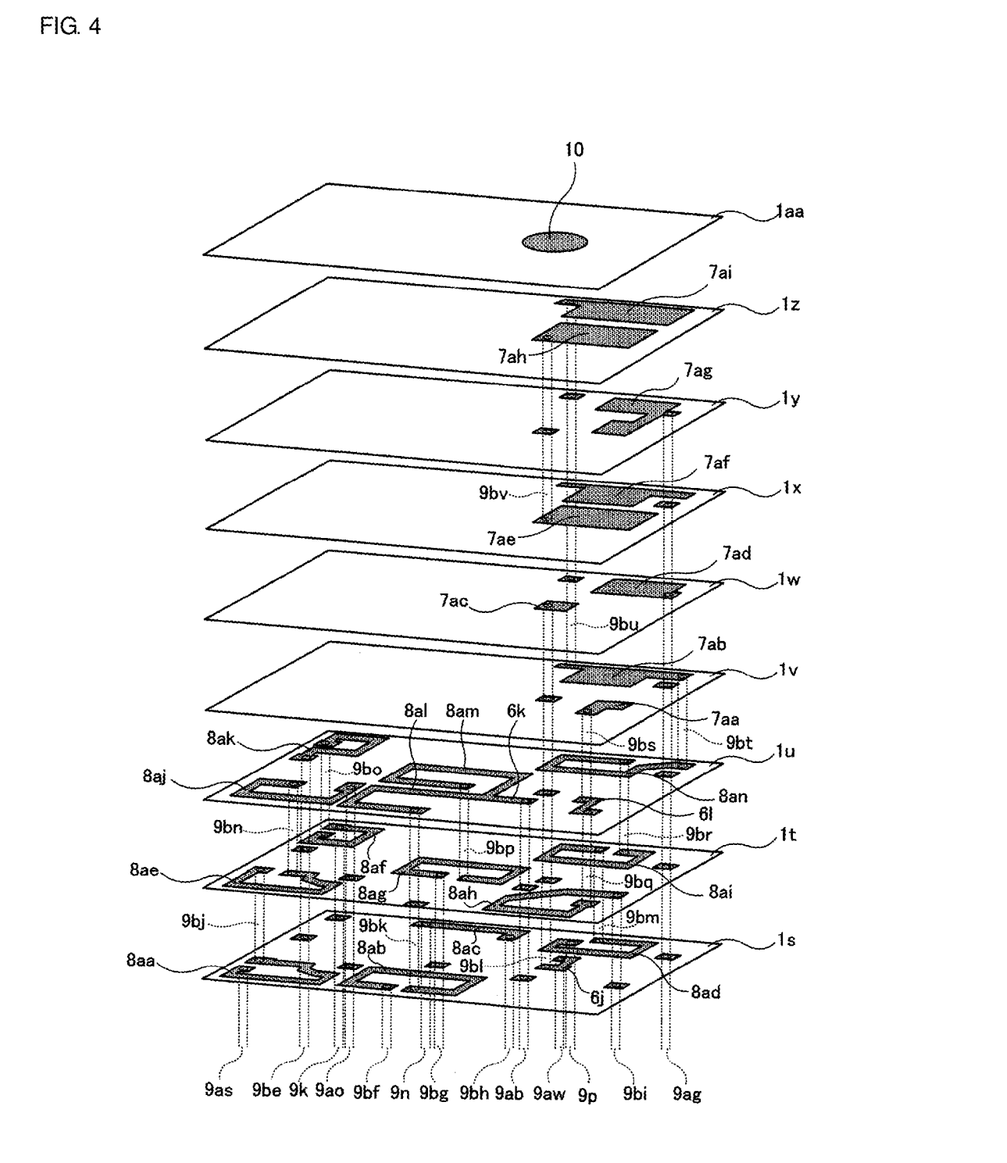
FIG. 4 is an exploded perspective view of an upper portion of the multilayer triplexer 100.

FIGS. 1 to 4 illustrate a multilayer triplexer 100 according to a preferred embodiment of the present invention. FIG. 1 is a perspective view of the multilayer triplexer 100. FIGS. 2 to 4 are exploded perspective views of the multilayer triplexer 100. FIG. 2 illustrates a lower part of the multilayer triplexer 100, FIG. 3 illustrates a middle part of the multilayer triplexer 100, and FIG. 4 illustrates an upper portion of the multilayer triplexer 100. An overall view of the multilayer triplexer 100 may be obtained by putting FIGS. 2 to 4 together.

Components may be herein denoted by alphabetic characters. The alphabetic characters are assigned, in principle, in the order of a to z. When more characters are needed, aa to az may be used. If necessary, ba to bz may also be used. Not all of these characters may be assigned in alphabetical order. There may be some skipped signs in between.

Some relay electrodes description of which are deemed unnecessary may be referred to without using reference signs and may not be further elaborated.

The multilayer triplexer 100 includes a multilayer body 1, which includes 27 substrate layers, namely, substrate layers 1a to 1aa stacked in this order from bottom to top. The multilayer body 1 (the substrate layers 1a to 1aa) may be made of any suitable material, such as low-temperature co-fired ceramics, for example. The following describes terminals, electrodes, and conductor patterns on upper and lower main surfaces of the substrate layers 1a to 1aa.

A common terminal 2a, a first branch terminal 3a for a low band, a second branch terminal 3b for a middle band, a third branch terminal 3c for a high band, and ground terminals 4a to 4d are provided on the lower main surface of the substrate layer 1a.

A ground electrode 5a and relay electrodes 6a to 6d are provided on the upper main surface of the substrate layer 1b. The ground electrode may also define and function as a capacitor electrode.

Capacitor electrodes 7a to 7e are provided on the upper main surface of the substrate layer 1c. Each of the capacitor electrodes may also define and function as a capacitor electrode.

Capacitor electrodes 7f to 7h are provided on the upper main surface of the substrate layer 1d.

A relay electrode 6e and capacitor electrodes 7i to 7k are provided on the upper main surface of the substrate layer 1e.

Capacitor electrodes 7l and 7m are provided on the upper main surface of the substrate layer 1f.

A capacitor electrode 7n is provided on the upper main surface of the substrate layer 1g.

Capacitor electrodes 7o and 7p are provided on the upper main surface of the substrate layer 1h. The capacitor electrodes 7o and 7p are connected to each other.

A relay electrode 6f and capacitor electrodes 7q and 7r are provided on the upper main surface of the substrate layer 1i.

Capacitor electrodes 7s to 7u are provided on the upper main surface of the substrate layer 1j. The capacitor electrodes 7s and 7t are connected to each other.

A capacitor electrode 7v is provided on the upper main surface of the substrate layer 1k.

Coil conductor patterns 8a and 8b are provided on the upper main surface of the substrate layer 1l.

Coil conductor patterns 8c and 8d are provided on the upper main surface of the substrate layer 1m.

A relay electrode 6g and coil conductor patterns 8e to 8h are provided on the upper main surface of the substrate layer in.

A relay electrode 6h and coil conductor patterns 8i to 8l are provided on the upper main surface of the substrate layer 1o.

Coil conductor patterns 8m and 8n are provided on the upper main surface of the substrate layer 1p.

Coil conductor patterns 8o to 8r are provided on the upper main surface of the substrate layer 1q.

A relay electrode 6i and coil conductor patterns 8s to 8w are provided on the upper main surface of the substrate layer 1r.

A relay electrode 6j and coil conductor patterns 8aa to 8ad are provided on the upper main surface of the substrate layer is.

Coil conductor patterns 8ae to 8ai are provided on the upper main surface of the substrate layer 1t.

Relay electrodes 6k and 6l and coil conductor patterns 8aj to 8an are provided on the upper main surface of the substrate layer 1u.

Capacitor electrodes 7aa and 7ab are provided on the upper main surface of the substrate layer 1v.

Capacitor electrodes 7ac and 7ad are provided on the upper main surface of the substrate layer 1w.

Capacitor electrodes 7ae and 7af are provided on the upper main surface of the substrate layer 1x.

A capacitor electrode lag is provided on the upper main surface of the substrate layer 1y.

Capacitor electrodes 7ah and 7ai are provided on the upper main surface of the substrate layer 1z.

As a directional marker, a mark 10 is provided on the upper main surface of the substrate layer 1aa.

Via conductors, each of which extends through opposite main surfaces of one or more of the substrate layers a to z, are provided as necessary. The following describes the via conductors.

Through a via conductor 9a, the common terminal 2a and one end of the relay electrode 6c are connected to each other.

Through a via conductor 9b, the first branch terminal 3a is connected to one end of the relay electrode 6a. Through a via conductor 9c, the second branch terminal 3b is connected to one end of the relay electrode 6b. Through a via conductor 9d, the third branch terminal 3c is connected to one end of the relay electrode 6d.

Through a via conductor 9e, the ground terminal 4a is connected to the ground electrode 5a. Through a via conductor 9f, the ground terminal 4b is connected to the ground electrode 5a. Through a via conductor 9g, the ground terminal 4c is connected to the ground electrode 5a. Through a via conductor 9h, the ground terminal 4d is connected to the ground electrode 5a.

Through a via conductor 9i, the other end of the relay electrode 6c is connected to one end of the relay electrode 6e. Through a via conductor 9j, the other end of the relay electrode 6a is connected to the capacitor electrode 7i and to one end of the coil conductor pattern 8a. Through a via conductor 9k, the other end of the relay electrode 6b is connected to the capacitor electrode 7q and to one end of the coil conductor pattern 8af. Through a via conductor 9l, the other end of the relay electrode 6d is connected to the capacitor electrode 7e.

Through a via conductor 9m, the ground electrode 5a is connected to the capacitor electrode 7g. Through a via conductor 9n, the ground electrode 5a is connected to one end of the coil conductor pattern 8ac. Through a via conductor 9o, the ground electrode 5a is connected to the capacitor electrode 7h. Through a via conductor 9p, the ground electrode 5a is connected to one end of the coil conductor pattern 8ad. Through a via conductor 9q, the ground electrode 5a is connected to one end of the coil conductor pattern 8d.

Through a via conductor 9r, the capacitor electrode 7b is connected to one end of the coil conductor pattern 8c. Through a via conductor 9s, the capacitor electrode 7a is connected to the capacitor electrode 7j and the capacitor electrode 7n. Through a via conductor 9t, the capacitor electrode 7c is connected to the capacitor electrode 7p. Through a via conductor 9u, the capacitor electrode 7e is connected to one end of the coil conductor pattern 8n. Through a via conductor 9v, the capacitor electrode 7d is connected to the capacitor electrode 7k.

Through a via conductor 9w, the capacitor electrode 7f is connected to the capacitor electrode 7l, to the other end of the coil conductor pattern 8a, and to one end of the relay electrode 6h.

Through a via conductor 9aa, the capacitor electrode 7k is connected to one end of the relay electrode 6f.

Through a via conductor 9ab, the other end of the relay electrode 6e is connected to one end of the coil conductor pattern 8r and to one end of the relay electrode 6k.

Through a via conductor 9ac, the capacitor electrode 7n is connected to one end of the relay electrode 6g. Through a via conductor 9ad, the capacitor electrode 7n is connected to one end of the coil conductor pattern 8f.

Through a via conductor 9ae, a junction of the capacitor electrodes 7o and 7p is connected to a junction of the capacitor electrodes 7s and 7t.

Through a via conductor 9af, the capacitor electrode 7r is connected to one end of the coil conductor pattern 8g. Through a via conductor 9ag, the other end of the relay electrode 6f is connected to one end of the coil conductor pattern 8m, to the capacitor electrode lad, and to the capacitor electrode lag.

Through a via conductor 9ah, the capacitor electrode 7s is connected to one end of the relay electrode 6i. Through a via conductor 9ai, the capacitor electrode 7u is connected to one end of the coil conductor pattern 8j.

Through a via conductor 9*aj*, the other end of the coil conductor pattern 8*b* is connected to the other end of the coil conductor pattern 8*m*. Through a via conductor 9*ak*, one end of the coil conductor pattern 8*b* is connected to the other end of the coil conductor pattern 8*n*.

Through a via conductor 9*a*1, the other end of the coil conductor pattern 8*c* is connected to one end of the coil conductor pattern 8*e*. Through a via conductor 9*am*, the other end of the coil conductor pattern 8*d* is connected to one end of the coil conductor pattern 8*h*.

Through a via conductor 9*an*, the other end of the coil conductor pattern 8*e* is connected to one end of the coil conductor pattern 8*i*. Through a via conductor 9*ao*, the other end of the relay electrode 6*g* is connected to one end of the coil conductor pattern 8*aj*. Through a via conductor 9*ap*, the other end of the coil conductor pattern 8*f* is connected to one end of the coil conductor pattern 8*p*. Through a via conductor 9*aq*, the other end of the coil conductor pattern 8*g* is connected to one end of the coil conductor pattern 8*k*. Through a via conductor 9*ar*, the other end of the coil conductor pattern 8*h* is connected to one end of the coil conductor pattern 8*l*.

Through a via conductor 9*as*, the other end of the relay electrode 6*h* is connected to one end of the coil conductor pattern 8*aa*. Through a via conductor 9*at*, the other end of the coil conductor pattern 8*i* is connected to one end of the coil conductor pattern 8*o*. Through a via conductor 9*au*, the other end of the coil conductor pattern 8*j* is connected to one end of the coil conductor pattern 8*v*. Through a via conductor 9*av*, the other end of the coil conductor pattern 8*k* is connected to one end of the coil conductor pattern 8*q*. Through a via conductor 9*aw*, the other end of the coil conductor pattern 8*l* is connected to one end of the relay electrode 6*j*.

Through a via conductor 9*ba*, the other end of the coil conductor pattern 8*o* is connected to one end of the coil conductor pattern 8*s*. The other end of the coil conductor pattern 8*s* is connected to the other end of the relay electrode 6*i*. Through a via conductor 9*bb*, the other end of the coil conductor pattern 8*p* is connected to one end of the coil conductor pattern 8*u*. Through a via conductor 9*bc*, the other end of the coil conductor pattern 8*q* is connected to one end of the coil conductor pattern 8*w*. Through a via conductor 9*bd*, the other end of the coil conductor pattern 8*r* is connected to one end of the coil conductor pattern 8*x*.

Through a via conductor 9*be*, a junction where the other end of the coil conductor pattern 8*s* and the other end of the relay electrode 6*i* are connected to each other is connected to one end of the coil conductor pattern 8*ak*. Through a via conductor 9*bf*, the other end of the coil conductor pattern 8*u* is connected to one end of the coil conductor pattern 8*ab*. Through a via conductor 9*bg*, the other end of the coil conductor pattern 8*v* is connected to one end of the coil conductor pattern 8*ag*. Through a via conductor 9*bh*, the other end of the coil conductor pattern 8*w* is connected to the other end of the coil conductor pattern 8*ac*. Through a via conductor 9*bi*, the other end of the coil conductor pattern 8*x* is connected to one end of the coil conductor pattern 8*ah*.

Through a via conductor 9*bj*, the other end of the coil conductor pattern 8*aa* is connected to one end of the coil conductor pattern 8*ae*. Through a via conductor 9*bk*, the other end of the coil conductor pattern 8*ab* is connected to one end of the coil conductor pattern 8*a*1. Through a via conductor 9*b*1, the other end of the relay electrode 6*j* is connected to the capacitor electrode 7*ac*. Through a via conductor 9*bm*, the other end of the coil conductor pattern 8*ad* is connected to one end of the coil conductor pattern 8*ai*.

Through a via conductor 9*bn*, the other end of the coil conductor pattern 8*ae* is connected to one end of the coil conductor pattern 8*aj*. Through a via conductor 9*bo*, the other end of the coil conductor pattern 8*af* is connected to the other end of the coil conductor pattern 8*ak*. Through a via conductor 9*bp*, the other end of the coil conductor pattern 8*ag* is connected to the other end of the coil conductor pattern 8*am*. The other end of the coil conductor pattern 8*am* is connected to the other end of the relay electrode 6*k* and to the other end of the coil conductor pattern 8*a*1. Through a via conductor 9*bq*, the other end of the coil conductor pattern 8*ah* is connected to one end of the relay electrode 6*l*. Through a via conductor 9*br*, the other end of the coil conductor pattern 8*ai* is connected to the other end of the coil conductor pattern 8*an*.

Through a via conductor 9*bs*, the other end of the relay electrode 6*l* is connected to the capacitor electrode 7*aa*. Through a via conductor 9*bt*, the other end of the coil conductor pattern 8*an* is connected to the capacitor electrode 7*ab*.

Through a via conductor 9*bu*, the capacitor electrode 7*ab* is connected to the capacitor electrode 7*af* and the capacitor electrode 7*ai*.

Through a via conductor 9*bv*, the capacitor electrode Tae is connected to the capacitor electrode 7*ah*.

The common terminal 2*a*, the first branch terminal 3*a*, the second branch terminal 3*b*, the third branch terminal 3*c*, the ground terminals 4*a* to 4*d*, the ground electrode 5*a*, the relay electrodes 6*a* to 6*l*, the capacitor electrodes 7*a* to 7*ai*, the coil conductor patterns 8*a* to 8*an*, the via conductors 9*a* to 9*bv* may be made of any suitable materials. For example, each of them may be made mainly of copper, silver, aluminum, a copper alloy, a silver alloy, or an aluminum alloy. Plating may be applied to surfaces of the common terminal 2*a*, the first branch terminal 3*a*, the second branch terminal 3*b*, the third branch terminal 3*c*, and the ground terminals 4*a* to 4*d*.

Commonly-used methods for producing multilayer triplexers may be used to produce the multilayer triplexer 100 having the aforementioned structure.

Figure 5:
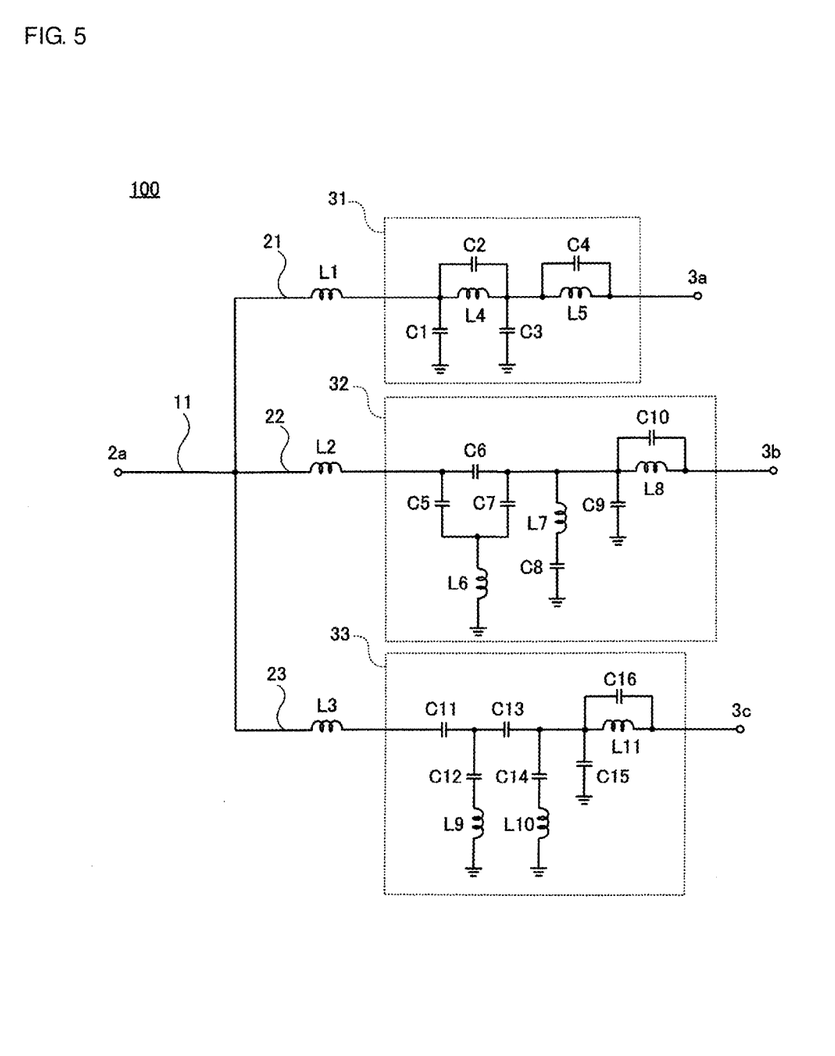
FIG. 5 is an equivalent circuit diagram of the multilayer triplexer 100.

The multilayer triplexer 100 having the aforementioned structure includes an equivalent circuit illustrated in FIG. 5.

The multilayer triplexer 100 includes the common terminal 2*a*, the first branch terminal 3*a* for the low band, the second branch terminal 3*b* for the middle band, and the third branch terminal 3*c* for the high band.

The common terminal 2*a* is connected to a common signal path 11. The common signal path 11 branches into a low-band signal path 21, a middle-band signal path 22, and a high-band signal path 23.

Any suitable frequency ranges may be assigned to these bands. In the present preferred embodiment, for example, the low band is preferably a frequency range of about 617 MHz to about 960 MHz, the middle band is preferably a frequency range of about 1,427 MHz to about 2,690 MHz, and the high band is preferably a frequency range of about 3,300 MHz to about 3,800 MHz.

A coil L1, which provides impedance adjustment, and a first LC filter 31 are connected to the low-band signal path 21. The coil L1 corresponds to a "first coil". The low-band signal path 21 extends to the first branch terminal 3*a*.

The first LC filter 31 includes a coil L4 and a coil L5, which are connected, in this order, between the coil L1 and the first branch terminal 3*a*. A capacitor C1 is connected between a junction where the coils L1 and L4 are connected to each other and the ground. A capacitor C2 is connected in parallel to the coil L4. A capacitor C3 is connected between a junction where the coils L4 and L5 are connected to each other and the ground. A capacitor C4 is connected in parallel to the coil L5.

A coil L2, which provides impedance adjustment, and a second LC filter 32 are connected to the middle-band signal path 22. The coil L2 corresponds to a "second coil". The middle-band signal path 22 extends to the second branch terminal 3b.

The second LC filter 32 includes a capacitor C6 and a coil L8, which are connected, in this order, between the coil L2 and the second branch terminal 3b. One end of the capacitor C6 is connected to one end of a capacitor C5. The other end of the capacitor C6 is connected to one end of a capacitor C7. The other end of the capacitor C5 and the other end of the capacitor C7 are connected to each other. A coil L6 is connected between a junction where the other end of the capacitor C5 and the other end of the capacitor C7 are connected to each other and the ground. A coil L7 and a capacitor C8 are connected, in this order, between a junction where the capacitor C6 and the coil L8 are connected to each other and the ground. A capacitor C9 is connected between a junction where the capacitor C6 and the coil L8 are connected to each other and the ground. A capacitor C10 is connected in parallel to the coil L8.

A coil L3, which provides impedance adjustment, and a third LC filter 33 are connected to the high-band signal path 23. The coil L3 corresponds to a "third coil". The high-band signal path 21 extends to the third branch terminal 3c.

The third LC filter 33 includes a capacitor C11, a capacitor C13, and a coil L11, which are connected, in this order, between the coil L3 and the third branch terminal 3c. A capacitor C12 and a coil L9 are connected, in this order, between a junction where the capacitors C11 and C13 are connected to each other and the ground. A capacitor C14 and a coil L10 are connected, in this order, between a junction where the capacitor C13 and the coil L11 are connected to each other and the ground. A capacitor C15 is connected between a joint where the capacitor C13 and the coil L11 are connected to each other and the ground. A capacitor C16 is connected in parallel to the coil L11.

The following describes the relationship between the structure of the multilayer triplexer 100 and the equivalent circuit.

The common signal path 11 extends from the common terminal 2a and serially connects the via conductor 9a, the relay electrode 6c, the via conductor 9i, the relay electrode 6e, the via conductor 9ab, and the relay electrode 6k to each other in this order. As described above, the low-band signal path 21, the middle-band signal path 22, and the high-band signal path 23 branch from the respective points on the common signal path 11.

The low-band signal path 21 branches from the other end of the relay electrode 6k on the common signal path 11. Specifically, the coil L1 providing impedance adjustment is connected to the other end of the relay electrode 6k.

The coil L1 providing impedance adjustment extends from the other end of the relay electrode 6k, serially connects the coil conductor pattern 8a1, the via conductor 9bk, the coil conductor pattern 8ab, the via conductor 9bf, the coil conductor pattern 8u, the via conductor 9bb, the coil conductor pattern 8p, the via conductor 9ap, the coil conductor pattern 8f, and the via conductor 9ad to each other in this order, and leads to the capacitor electrode 7n.

The coil L4 in the first LC filter 31 includes a path that extends from the capacitor electrode 7n, serially connects the via conductor 9ac, the relay electrode 6g, the via conductor 9ao, the coil conductor pattern 8aj, the via conductor 9bn, the coil conductor pattern 8ae, the via conductor 9bj, the coil conductor pattern 8aa, the via conductor 9as, the relay electrode 6h, and the via conductor 9w to each other in this order, and leads to the other end of the coil conductor pattern 8a.

The coil L5 in the first LC filter 31 is the coil conductor pattern 8a. As described above, the other end of the coil conductor pattern 8a is connected with the coil L4. The one end of the coil conductor pattern 8a is connected to the first branch terminal 3a for the low band through a path that serially connects the via conductor 9j, the relay electrode 6a, and the via conductor 9b to each other in this order.

The capacitor C1 in the first LC filter 31 mainly includes the capacitor electrodes 7j and 7a as electrodes on one side and the capacitor electrode 7h as an electrode on the other side. The capacitor electrodes 7j and 7a are connected through the via conductor 9s to the capacitor electrode 7n connected with the coil L1. The capacitor electrode 7h is connected to the ground electrode 5a through the via conductor 9o.

The capacitor C2 in the first LC filter 31 mainly includes the capacitor electrode 7n and 7j as electrodes on one side and the capacitor electrode 7m as an electrode on the other side. As described above, the capacitor electrode 7n is connected with the coil L1. The capacitor electrode 7j is connected to the capacitor electrode 7n through the via conductor 9s. The capacitor electrode 7m is connected to the other end of the coil conductor pattern 8a, namely, the other end of the coil L5 through the capacitor electrode 7l and the via conductor 9w.

The capacitor C3 in the first LC filter 31 mainly includes the capacitor electrode 7f as an electrode on one side and the ground electrode 5a as an electrode on the other side. The capacitor electrode 7f is connected through the via conductor 9w to the other end of the coil conductor pattern 8a, that is, to the junction of the coils L4 and L5.

The capacitor C4 in the first LC filter 31 mainly includes the capacitor electrodes 7f and 7l as electrodes on one side and the capacitor electrode 7i as an electrode on the other side. The capacitor electrodes 7f and 7l are connected through the via conductor 9w to the other end of the coil conductor pattern 8a, that is, to the junction of the coils L4 and L5. The capacitor electrode 7i is connected through the via conductor 9j to the one end of the coil conductor pattern 8a, that is, to the other end of the coil L5.

The middle-band signal path 22 branches from the other end of the relay electrode 6k on the common signal path 11. Specifically, the coil L2 providing impedance adjustment is connected to the other end of the relay electrode 6k.

The coil L2 providing impedance adjustment extends from the other end of the relay electrode 6k, serially connects the coil conductor pattern 8am, the via conductor 9bp, the coil conductor pattern 8ag, the via conductor 9bg, the coil conductor pattern 8v, the via conductor 9au, the coil conductor pattern 8j, and the via conductor 9ai to each other in this order, and leads to the capacitor electrodes 7u and 7v.

The capacitor C5 in the second LC filter 32 mainly includes the capacitor electrode 7u as an electrode on one side and the capacitor electrode 7r as an electrode on the other side. As described above, the capacitor electrode 7u is connected with the coil L2.

The capacitor C6 in the second LC filter 32 mainly includes the capacitor electrode 7v as an electrode on one side and the capacitor electrode 7s as an electrode on the other side. As described above, the capacitor electrode 7v is connected with the coil L2.

The capacitor C7 in the second LC filter 32 mainly includes the capacitor electrodes 7t and 7p as electrodes on one side and the capacitor electrode 7r as an electrode on the other side.

The coil L6 in the second LC filter 32 includes a path that extends from the capacitor electrode 7r, namely, the electrode on the other side of the capacitor C5 and the electrode on the other side of the capacitor C7, serially connects the via conductor 9af, the coil conductor pattern 8g, the via conductor 9aq, the coil conductor pattern 8k, the via conductor 9av, the coil conductor pattern 8q, the via conductor 9bc, the coil conductor pattern 8w, the via conductor 9bh, the coil conductor pattern 8ac, and the via conductor 9n to each other in this order, and leads to the ground electrode 5a.

Electrodes including the capacitor electrode 7s, namely, the electrode on the other side of the capacitor C6; the capacitor electrodes 7t and 7p, namely, the electrodes on the one side of the capacitor C7; and the capacitor electrode 7o are connected to each other through the via conductor 9ae. The capacitor electrodes 7t, 7s, 7o, and 7p are junctions where the capacitor C6 and the coil L8 are connected to each other.

The coil L7 in the second LC filter 32 includes a path that extends from the capacitor electrode 7s, namely, one of the junctions of the capacitor C6 and the coil L8, serially connects the via conductor 9ah, the relay electrode 6i, the coil conductor pattern 8s, the via conductor 9ba, the coil conductor pattern 8o, the via conductor 9at, the coil conductor pattern 8i, the via conductor 9an, the coil conductor pattern 8e, the via conductor 9a1, the coil conductor pattern 8c, and the via conductor 9n to each other in this order, and leads to the capacitor electrode 7b.

The capacitor C8 in the second LC filter 32 mainly includes the capacitor electrode 7b as an electrode on one side and the capacitor electrode 7g and the ground electrode 5a as electrodes on the other side. As described above, the capacitor electrode 7b is connected with the coil L7. The capacitor electrode 7g is connected to the ground electrode 5a through the via conductor 9m.

The capacitor C9 in the second LC filter 32 mainly includes the capacitor electrode 7c as an electrode on one side and the ground electrode 5a as an electrode on the other side. The capacitor electrode 7c is connected through the via conductor 9t to the capacitor electrode 7p, namely, one of the junctions of the capacitor C6 and the coil L8.

The coil L8 in the second LC filter 32 includes a path that extends from the capacitor electrode 7s, namely, one of the junctions of the capacitor C6 and the coil L8, serially connects the via conductor 9ah, the relay electrode 6i, the via conductor 9be, the coil conductor pattern 8ak, the via conductor 9bo, the coil conductor pattern 8af, the via conductor 9k, the relay electrode 6b, and the via conductor 9c to each other in this order, and leads to the second branch terminal 3b.

The capacitor C10 in the second LC filter 32 mainly includes the capacitor electrode 7o as an electrode on one side and the capacitor electrode 7q as an electrode on the other side. The capacitor electrode 7o is one of the junctions of the capacitor C6 and the coil L8. The capacitor electrode 7q is connected to the second branch terminal 3b through the via conductor 9k, the relay electrode 6b, and the via conductor 9c.

A branch point at which the high-band signal path 23 branches off from the common signal path 11 is a location in which the via conductor 9ab on the common signal path 11 is connected with the one end of the coil conductor pattern 8r.

The coil L3 providing impedance adjustment extends from the one end of the coil conductor pattern 8r, serially connects the coil conductor pattern 8r, the via conductor 9bd, the coil conductor pattern 8x, the via conductor 9bi, the coil conductor pattern 8ah, the relay electrode 6l, and the via conductor 9bs to each other in this order, and leads to the capacitor electrode 7aa.

The capacitor C11 in the third LC filter 33 mainly includes the capacitor electrode 7aa as an electrode on one side and the capacitor electrode Tae as an electrode on the other side. As described above, the capacitor electrode 7aa is connected with the coil L3.

The capacitor C13 in the third LC filter 33 mainly includes the capacitor electrodes 7ae and 7ah as electrodes on one side and the capacitor electrode lag as an electrode on the other side. As described above, the capacitor electrode Tae is the electrode on the other side of the capacitor C11. The capacitor electrode 7ah is connected to the capacitor electrode Tae through the via conductor 9bv.

The coil L11 in the third LC filter 33 includes a path that extends from the capacitor electrode 7ag, namely, the electrode on the other side of the capacitor C13, serially connects the via conductor 9ag, the coil conductor pattern 8m, the via conductor 9aj, the coil conductor pattern 8b, the via conductor 9ak, the coil conductor pattern 8n, the via conductor 9u, the capacitor electrode 7e, the via conductor 9l, the relay electrode 6d, and the via conductor 9d in this order, and is connected to the third branch terminal 3c for the high band accordingly.

The capacitor C12 in the third LC filter 33 mainly includes the capacitor electrode Tae as an electrode on one side and the capacitor electrode 7ac as an electrode on the other side. As described above, the capacitor electrode Tae is the electrode on the other side of the capacitor C11 and is also the electrode on the one side of the capacitor C13, thus being the junction of the capacitors C11 and C13.

The coil L9 in the third LC filter 33 includes a path that extends from the capacitor electrode 7ac, namely, the electrode on the other side of the capacitor C12, serially connects the via conductor 9a1, the relay electrode 6j, the via conductor 9aw, the coil conductor pattern 8l, the via conductor 9ar, the coil conductor pattern 8h, the via conductor 9am, the coil conductor pattern 8d, and the via conductor 9q to each other in this order, and leads to the ground electrode 5a.

The capacitor C14 in the third LC filter 33 mainly includes the capacitor electrodes 7ad and 7ag as electrodes on one side and the capacitor electrodes 7ai, 7af, and 7ab as electrodes on the other side. As described above, the capacitor electrode 7ag is the electrode on the other side of the capacitor C13. The capacitor electrode 7ad is connected to the capacitor electrode 7ag through the via conductor 9ag. The capacitor electrodes 7ai, 7af, and 7ab are connected to each other through the via conductor 9bu.

The coil L10 in the third LC filter 33 includes a path that extends from the capacitor electrode 7ab, namely, one of the electrodes on the other side of the capacitor C14, serially connects the via conductor 9bt, the coil conductor pattern 8an, the via conductor 9br, the coil conductor pattern 8ai, the via conductor 9bm, the coil conductor pattern 8ad, and the via conductor 9p to each other in this order, and leads to the ground electrode 5a.

The capacitor C15 in the third LC filter 33 includes the capacitor electrode 7d as an electrode on one side and the ground electrode 5a as an electrode on the other side. The capacitor electrode 7d is connected to the capacitor electrode 7ag, namely, the electrode on the other side of the capacitor C13 through the via conductor 9v, the capacitor electrode 7k, the via conductor 9aa, the relay electrode 6f, and the via conductor 9v.

The capacitor C16 in the third LC filter 33 includes the capacitor electrode 7k as an electrode on one side and the capacitor electrode 7e as an electrode on the other side. The capacitor electrode 7k is connected to the capacitor electrode 7ag, namely, the electrode on the other side of the capacitor C13 through the via conductor 9aa, the relay electrode 6f, and the via conductor 9v. The capacitor electrode 7e is connected to the third branch terminal 3c through the via conductor 9l, the relay electrode 6d, and the via conductor 9d.

The multilayer triplexer 100 according to the present preferred embodiment includes the coil L1 connected as a stage preceding the first LC filter 31, the coil L2 connected as a stage preceding the second LC filter 32, and the coil L3 connected as a stage preceding the third LC filter 33. Unlike the triplexer known in the art, the multilayer triplexer 100 does not include parallel resonant circuits each of which includes a coil and a capacitor and is connected as a stage preceding a corresponding filter. The multilayer triplexer 100 thus eliminates the possibility that signals in a band will pass through a capacitor of a parallel resonant circuit and will consequently be mixed with signals in another band.

Another feature of the multilayer triplexer 100 according to the present preferred embodiment is that the coil conductor patterns 8f, 8p, 8u, 8ab, and 8a1 of the coil L1, the coil conductor patterns 8j, 8v, 8ag, and 8am of the coil L2, and the coil conductor patterns 8r, 8x, and 8ah of the coil L3 are arranged with no overlap between the coil conductor patterns of different ones of these coils when the multilayer body 1 is seen through in the direction in which the substrate layers 1a to 1aa are stacked on one another.

Figure 6:
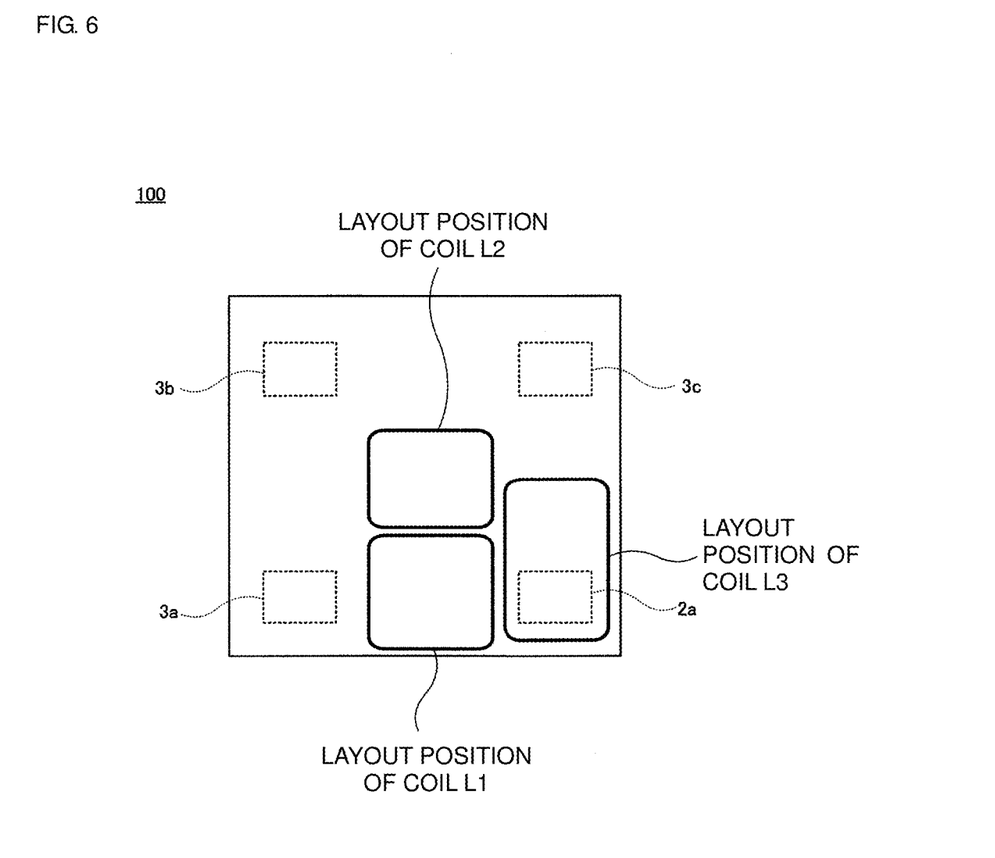
FIG. 6 is a plan view of the multilayer triplexer 100.

Layout positions of the coils L1, L2, and L3 in the multilayer triplexer 100 are shown in FIG. 6. As illustrated in FIG. 6, the coil conductor patterns are arranged with no overlap between the coil conductor patterns of different ones of these coils when the multilayer body 1 is seen through in the direction in which the substrate layers 1a to 1aa are stacked on one another. Stray capacitance between the coil conductor patterns of the different coils may be reduced or prevented accordingly. The multilayer triplexer 100 thus eliminates or reduces the possibility that signals in a band will pass through the stray capacitance and will consequently be mixed with signals in another band.

Another feature of the multilayer triplexer 100 according to the present preferred embodiment is the arrangement of the coil conductor patterns of the coil L2 and the coil conductor patterns of the coil L3. Specifically, the coil conductor patterns of the same coil are arranged such that a coil conductor pattern between two layers and a coil conductor pattern between another two layers do not coincide with each other in the width direction when the multilayer body 1 is seen through in the direction in which the substrate layers 1a and 1aa are stacked on one another.

Figure 7:
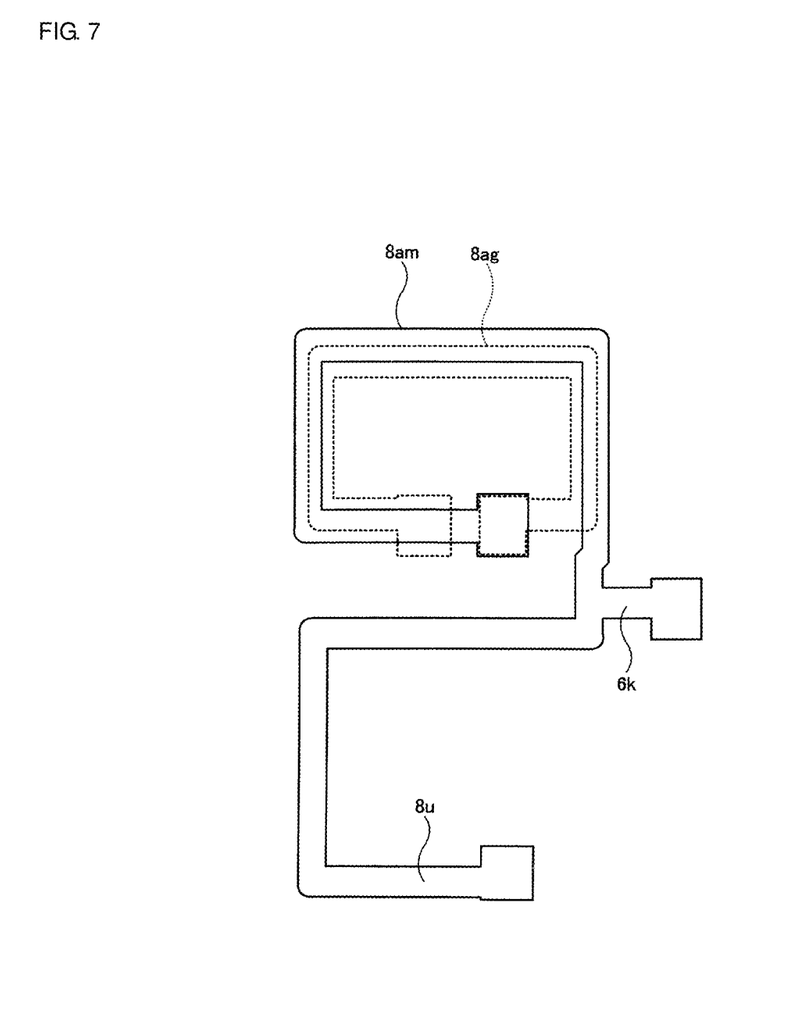
FIG. 7 is a see-through plan view of the multilayer triplexer 100.

FIG. 7 shows a comparison of the coil conductor patterns 8am and 8ag, which are different ones of the coil conductor patterns of the coil L2. As illustrated in FIG. 7, the coil conductor pattern 8am (denoted by a solid line) and the coil conductor pattern 8ag (denoted by a broken line) do not coincide with each other in the width direction. Of a plurality of coil conductor patterns included in the same coil, a coil conductor pattern between two layers and a coil conductor pattern between another two layers may have stray capacitance produced therebetween when these coil conductor patterns entirely overlap each other. When the coil conductor patterns do not coincide with each other in the width direction, the stray capacitance may be reduced or prevented. This layout eliminates or reduces the possibility that signals in a band will pass through the stray capacitance and will consequently be mixed with signals in another band.

The coil L3 is designed in the same or similar manner. The same does not hold true for the coil L1, which provides impedance adjustment and is connected to the low-band signal path and requires a large inductance value. The coil conductor patterns 8p, 8u, 8ab, and 8a1 are designed as the largest possible conductor patterns and are arranged so as to entirely overlap each other. These features enable the coil L1 to achieve a large inductance value.

Figure 8:
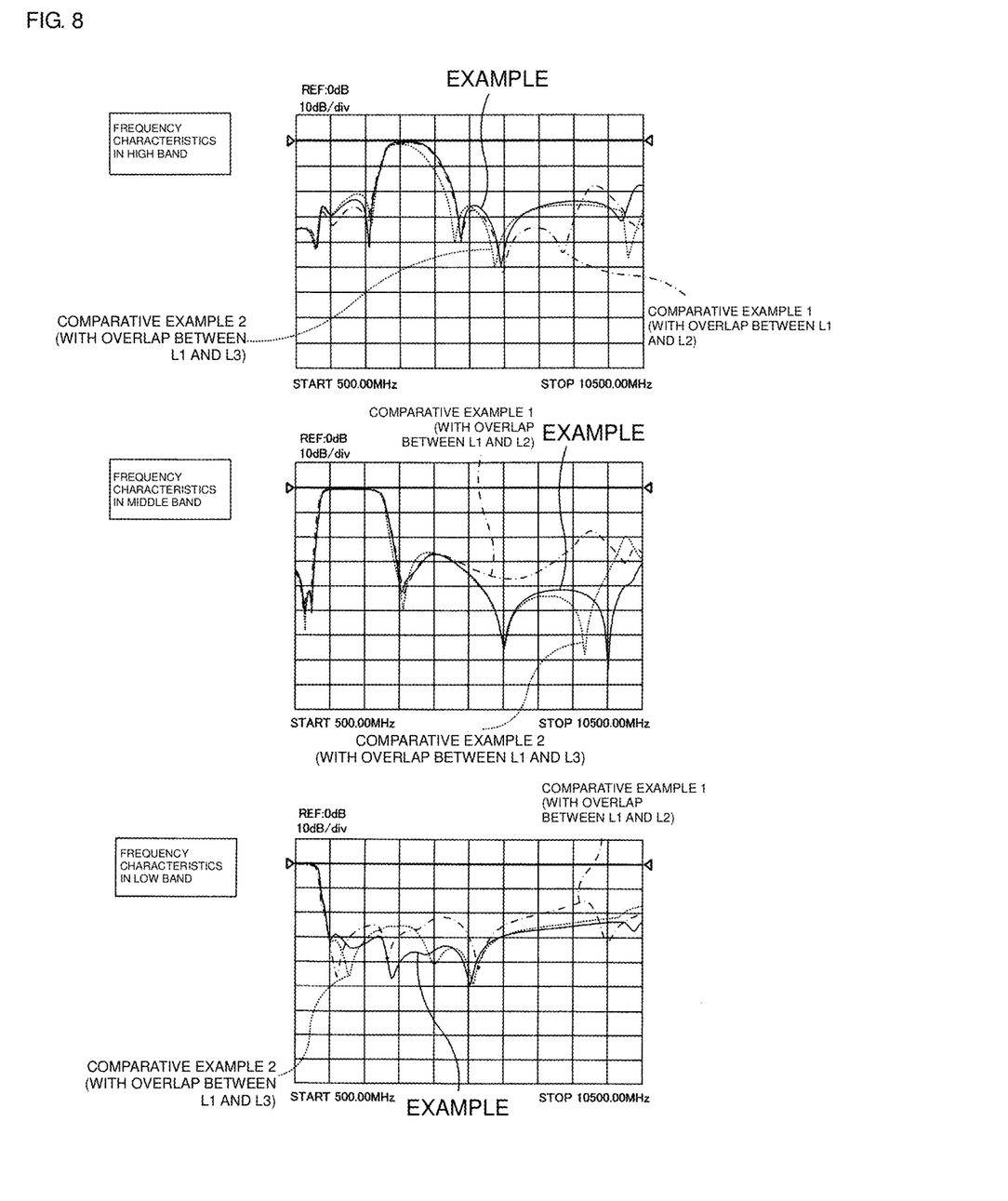
FIG. 8 includes graphs each illustrating the frequency characteristics of the multilayer triplexer 100, the frequency characteristics of a Comparative Example 1, and the frequency characteristics of a Comparative Example 2.

Example (denoted by a solid line) in FIG. 8 refers to the frequency characteristics of the multilayer triplexer 100 according to the present preferred embodiment. For comparison, the frequency characteristics of Comparative Example 1 and the frequency characteristics of Comparative Example 2 are also shown. The coils L1 and L2 in the multilayer body 1 according to Comparative Example 1 (denoted by a dash-dot line) overlap each other in the direction in which the substrate layers 1a to 1aa are stacked on one another. The coils L1 and L3 in the multilayer body 1 according to Comparative Example 2 (denoted by a dotted line) overlap each other in the direction in which the substrate layers 1a to 1aa are stacked on one another.

As for Comparative Example 1, FIG. 8 indicates that the frequency characteristics in the low band and the frequency characteristics in the middle band are unfavorable. Specifically, in the low band, the amount of attenuation on the high-frequency side of the pass band is not sufficient. The same holds true for the middle band, where the amount of attenuation on the high-frequency side of the pass band is not sufficient. As for Comparative Example 2, the frequency characteristics in the low band and the frequency characteristics in the high band are unfavorable. Specifically, in the low band, the amount of attenuation on the high-frequency side of the pass band is not sufficient. In the high band, the band characteristics are not satisfactory due to a narrow pass band. In contrast, the multilayer triplexer 100 (Example) has favorable frequency characteristics, with the pass-band characteristics and the out-of-band frequency characteristics being satisfactory in all of the low band, the middle band, and the high band.

The multilayer triplexer 100 according to a preferred embodiment of the present invention has been described above. It should be noted that the present invention is not limited to the preferred embodiment above, and various alteration may be made.

For example, each of the first LC filter 31, the second LC filter 32, and the third LC filter 33 may have any suitable circuit configuration, which is not limited to the circuit configuration described above and illustrated in the drawings.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A multilayer triplexer comprising:
a multilayer body including substrate layers stacked on one another;

a common terminal, a first branch terminal, a second branch terminal, and a third branch terminal on a surface of the multilayer body;

a first filter, a second filter, and a third filter in the multilayer body, the first filter being connected to a path extending from the common terminal to the first branch terminal, the second filter being connected to a path extending from the common terminal to the second branch terminal, and the third filter being connected to a path extending from the common terminal to the third branch terminal;

a first coil connected between the common terminal and the first filter;

a second coil connected between the common terminal and the second filter; and a third coil connected between the common terminal and the third filter; wherein the first, second, and third coils each include a coil conductor pattern between ones of the substrate layers of the multilayer body;

the coil conductor pattern of the first coil, the coil conductor pattern of the second coil, and the coil conductor pattern of the third coil do not overlap each other when the multilayer body is viewed in a direction in which the substrate layers are stacked on one another;

the coil conductor pattern of at least one of the second and third coils includes a plurality of coil conductor patterns including a first coil conductor pattern between first ones of the substrate layers and a second coil conductor pattern between second ones of the substrate layers; and the first coil conductor pattern and the second coil conductor pattern do not coincide with each other in a width direction when the at least one of the second and third coils is viewed in the direction in which the substrate layers are stacked on one another.

2. The multilayer triplexer according to claim 1, wherein the first filter, the second filter, and the third filter are LC filters.

3. The multilayer triplexer according to claim 2, wherein the first filter includes:

fourth and fifth coils connected between the first coil and the first branch terminal;

a first capacitor connected between a junction where the first and fourth coils are connected to each other and a ground;

a second capacitor connected in parallel to the fourth coil;

a third capacitor connected between a junction where the fourth and fifth coils are connected to each other and the ground; and a fourth capacitor connected in parallel to the fifth coil.

4. The multilayer triplexer according to claim 2, wherein the second filter includes a first capacitor and fourth coil connected in this order between the second coil and the second branching terminal.

5. The multilayer triplexer according to claim 2, wherein the third filter includes a first and second capacitor and a fourth coil connected in this order between the third coil and the third branching terminal.

6. The multilayer triplexer according to claim 1, wherein the first coil, the second coil, and the third coil each have a winding axis parallel or substantially parallel to the direction in which the substrate layers are stacked on one another.

7. The multilayer triplexer according to claim 1, wherein the coil conductor pattern of at least one of the first, second, and third coils includes the first coil conductor pattern and the second coil conductor pattern;

the first coil conductor pattern partially overlaps the second coil conductor pattern in a width direction when the multilayer body is viewed in the direction in which the substrate layers are stacked on one another; and the second coil conductor pattern partially overlaps the first coil conductor pattern in the width direction when the multilayer body is viewed in the direction in which the substrate layers are stacked on one another.

8. The multilayer triplexer according to claim 1, wherein when the multilayer body is viewed in the direction in which the substrate layers are stacked on one another, the coil conductor pattern of one of the first to third coils encloses a region whose area is larger than an area of a region enclosed by the coil conductor pattern of any other coil and includes a third coil conductor pattern and a fourth coil conductor pattern between respective ones of the substrate layers and are U-shaped; and the third and fourth coil conductor patterns entirely overlap each other in a width direction.

9. The multilayer triplexer according to claim 1, wherein the substrate layers are made of low-temperature co-fired ceramics.

10. The multilayer triplexer according to claim 1, wherein the surface of the multilayer body on which the common terminal, the first branch terminal, and the second branch terminal are provided is a bottom surface of the multilayer body.

11. The multilayer triplexer according to claim 1, further comprising a directional marker on an upper surface of the multilayer substrate.

12. The multilayer triplexer according to claim 1, wherein the first filter is a band-pass filter in a frequency range of about 617 MHz to about 960 MHz;

the second filter is a band-pass filter in a frequency range of about 1,427 MHz to about 2,690 MHz; and the third filter is a band-pass filter in a frequency range of about 3,300 MHz to about 3,800 MHz.

13. The multilayer triplexer according to claim 1, wherein at least one of the first, second, and third coils is configured to provide impedance matching.

14. The multilayer triplexer according to claim 1, wherein the common terminal, the first branching terminal, the second branching terminal, and the third branching terminal are each made mainly of at least one of copper, silver, aluminum, a copper alloy, a silver alloy, or an aluminum alloy.

15. The multilayer triplexer according to claim 1, wherein the coil conductor pattern of the first coil includes a plurality of coil conductor patterns; and at least two of the plurality of conductor patterns of the first coil entirely overlap each other when the first coil is viewed in the direction in which the substrate layers are stacked on one another.

* * * * *